US006476408B1

(12) United States Patent
Legagneux et al.

(10) Patent No.: US 6,476,408 B1
(45) Date of Patent: Nov. 5, 2002

(54) FIELD EMISSION DEVICE

(75) Inventors: Pierre Legagneux, Voisins le Bretonneux; Didier Pribat, Sevres, both of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/486,693

(22) PCT Filed: Jul. 2, 1999

(86) PCT No.: PCT/FR99/01596

§ 371 (c)(1), (2), (4) Date: Mar. 2, 2000

(87) PCT Pub. No.: WO00/02222

PCT Pub. Date: Jan. 13, 2000

(30) Foreign Application Priority Data

Jul. 3, 1998 (FR) .......................................... 98 08554

(51) Int. Cl.$^7$ ............................ H01L 29/12; H01J 1/05

(52) U.S. Cl. ............................ 257/10; 257/77; 438/20; 313/311

(58) Field of Search .................... 257/10, 77; 313/498, 313/336, 311, 334; 438/20

(56) References Cited

U.S. PATENT DOCUMENTS

| | | | | |
|---|---|---|---|---|
| 4,413,170 A | | 11/1983 | Val et al. | |
| 4,498,952 A | * | 2/1985 | Christensen | 313/311 |
| 4,540,452 A | | 9/1985 | Croset et al. | |
| 4,952,526 A | | 8/1990 | Pribat et al. | |
| 4,956,073 A | | 9/1990 | Pribat et al. | |
| 4,986,787 A | | 1/1991 | Olivier et al. | |
| 4,999,314 A | | 3/1991 | Pribat et al. | |
| 5,017,340 A | | 5/1991 | Pribat et al. | |
| 5,053,833 A | | 10/1991 | Pribat et al. | |
| 5,087,275 A | | 2/1992 | Pribat et al. | |
| 5,090,932 A | | 2/1992 | Dieumegard et al. | |
| 5,127,990 A | | 7/1992 | Pribat et al. | |
| 5,262,348 A | | 11/1993 | Pribat et al. | |
| 5,268,648 A | * | 12/1993 | Calcatera | 313/336 |
| 5,273,929 A | | 12/1993 | Hirtz et al. | |
| 5,294,564 A | | 3/1994 | Karapiperis et al. | |
| 5,314,569 A | | 5/1994 | Pribat et al. | |
| 5,356,510 A | | 10/1994 | Pribat et al. | |
| 5,360,754 A | | 11/1994 | Pribat et al. | |
| 5,397,735 A | | 3/1995 | Mercandalli et al. | |
| 5,429,737 A | | 7/1995 | Pribat et al. | |
| 5,581,146 A | | 12/1996 | Pribat et al. | |
| 5,625,250 A | | 4/1997 | Pribat et al. | |
| 5,955,850 A | * | 9/1999 | Yamaguchi | 313/336 |
| 5,998,808 A | * | 12/1999 | Matsushita | 257/74 |
| 6,100,628 A | * | 8/2000 | Coll | 313/336 |
| 6,028,071 A1 | * | 3/2001 | Nishimura et al. | 313/495 |
| 6,204,595 B1 | * | 3/2001 | Falabella | 313/336 |

* cited by examiner

*Primary Examiner*—Jerome Jackson, Jr.
(74) *Attorney, Agent, or Firm*—Oblon, Spivak, McClelland, Maier & Neustadt, P.C.

(57) ABSTRACT

A field-emission device includes at least one plane cathode made of conductive material with a low electron affinity located on a face of a substrate carrying a layer of a dielectric material, which layer has at least one cavity in which the cathode is located. A gate made of conductive material is located on the dielectric layer and has an aperture centered with respect to the cavity. The conductive material with a low electron affinity is a material deposited in amorphous form. Such a device may find particular application to electron guns or display devices.

16 Claims, 12 Drawing Sheets

FIELD EMISSION DEVICE

BACKGROUND OF THE INVENTION

1. Field of the Invention

The invention relates to a field-emission display device. It is applicable to display screens of the flat-screen type and in particular high-resolution (100 μm pixel spacing), high-luminance (up to 500 cd/M$^2$) and low-consumption screens. It is also applicable to the production of a planar microgun electron source applicable especially in microlithography.

2. Discussion of the Background

A field-emission display (FED) screen is schematically composed of a cathode, an anode and an interelectrode space under vacuum. The cathode is a matrix of electron emitters which illuminate the anode where various phosphors, that is to say receptors, are placed. Since corresponding to each emitter there is a receptor, the resolution of a direct-viewing screen is defined by the interpixel spacing with which it is manufactured.

For small (less than 14 inch diagonal) high-resolution screens, this spacing is about 100 to 300 μm by 100 to 300 μm. Direct-viewing screens having the highest resolution are without doubt avionic screens which have to be manufactured with a pixel pitch of about 100 μm by 100 μm. In colour displays, the dot pitch is greater since a dot is composed of three-red, green and blue-pixels.

SUMMARY OF THE INVENTION

In order to avoid the phenomenon of colour crosstalk, 99% of the electrons emitted by an emitter must strike the receptor which corresponds to it. The size ($f_T$ by $f_T$) of the beam, emitted by an emitter of size $f_E$ by $f_E$, at the anode is equal to: $f_T(\mu m)=f_E+2X$, 2X being the broadening of the beam with respect to its initial size. For example, for a 40 by 40 μm emitter size, X must be less than or equal to 30 μm.

If each element emits a beam of electrons having an initial velocity $v_i$ in a cone of half-angle q, the anode-cathode distance $d_{ca}$ may be written in the form of the following formula:

$$d_{ca}=\frac{qE}{2m}\cdot t^2+v_0 t$$

with E: cathode-anode field (v/m)
m: electron mass: $9.1\times10^{-31}$ kg
q: electron charge: $1.6\times10^{-19}$ C
t: cathode-anode transit time (s)
$v_0$: orthogonal component of $v_i$ (m/s).

Since $\frac{1}{2}mv_i^2=qE_i$ and $v_0=v_i\cos\theta$, where $qE_i$ is the initial energy of the electrons (eV), then:

$$t^2+\sqrt{\frac{8mE_i\cos^2\theta}{qE^2}}\,t-\frac{2m}{qE}d_{ca}=0$$

The solution of this equation is:

$$t=\sqrt{\frac{2mE_i\cos^2\theta}{qE^2}+\frac{2md_{ca}}{qE}}-\sqrt{\frac{2mE_i\cos^2\theta}{qE^2}}$$

Since $$X=v_p t=\sqrt{\frac{2qE_i}{m}}\sin\theta\cdot t,$$

where $v_p$ is the parallel component of $v_i$ (m/s), then:

$$X=2\sin\theta\left(\sqrt{\frac{E_i^2\cos^2\theta}{E^2}+d_{ca}\frac{E_i}{E}}-\sqrt{\frac{E_i^2\cos^2\theta}{E^2}}\right)$$

$$X=2\sqrt{\frac{E_i}{E}}\sin\theta\left(\sqrt{d_{ca}+\frac{E_i}{E}\cos^2\theta}-\sqrt{\frac{E_i}{E}\cos^2\theta}\right)$$

In general (see examples described below), in order to avoid cathode-anode breakdown phenomena, $d_{ca}$ is chosen to be equal to $d_{ca}$(mm)=½ Va(kV), which corresponds to a field $E=2\times10^6$ V/m.

It should be noted that for low-energy (≈1 eV) electrons, the term $(E_i/E)\cos^2\theta$ becomes negligible. This is because $(E_i/E)\cos^2\theta\leqq E_i/E\leqq5\times10^7$ m<<$d_{ca}$.

The constraint on the luminance (500 cd/M$^2$) corresponds to a luminosity of 1600 Lm/m$^2$ and therefore to $1.6\times10^{-5}$ Lm per pixel (100 by 100 μm pixel). Taking a phosphor efficiency of 5 Lm/W (for electrons having an energy of 5 keV), we obtain 3.2 μW per pixel, which corresponds to an average current of 0.64 nA. Since each pixel emits during the time that the corresponding line is being addressed, the emission current per pixel must be 0.64 μA (for a screen with 1000 lines). This pixel current corresponds to current densities of 10 mA/cm$^2$, 18 mA/cm$^2$ and 40 mA/cm$^2$ for 80 by 80 μm, 60 by 60 μm and 40 by 40 μm emissive sources, respectively.

In order to determine a quality criterion for a screen with respect to the power dissipated for its operation, it is possible to define a parameter characteristic of the power needed to go from a black pixel to a white pixel, namely:

$$P=\frac{1}{2}\frac{C_p V_{scan}^2}{t_c}$$

where $C_p$ is the capacitance of a pixel, $V_{scan}$ is the difference between the addressing voltage for a white pixel and for a black pixel and $t_c$ is the charging time of the pixel, which is of the order of 10 μs. Consequently:

$$P(\mu W)=0.05\times C_p(pF)\times V_{scan}^2.$$

It should be noted that in the case of a liquid-crystal screen ($C_p$≈0.6 pF and $V_{scan}$=10 V), this parameter P is equal to 3 μW.

Within the technology of field-effect screens, the screen manufactured by the company Pixtech [1] is known. This screen uses a cathode with field-emission tips. Each emitter is composed of about 30 tips or more. According to S. T. Purcell et al. [2], the beam emitted by this type of cathode is composed of primary electrons having an initial energy of about 10 eV less than the gate voltage and of secondary electrons having an average energy of 7 eV. Assuming electrons with an initial energy of 90 eV (gate voltage=100 V) emitted in a cone of about 30° half-angle and striking an anode biased at 400 V, a distance $d_{ca}$ equal to 0.2 mm and X=69 μm are obtained. Since the emitting surface seems to be about 40 μm along the axis for which the pixel pitch is 100 μm, a beam size of the order of 180 μm is obtained.

According to Futaba [1], $\phi_T$ is equal to 230 $\mu$m for 95% of the electrons emitted by an emitter. In order to obtain a beam size of less than 100 $\mu$m, Futaba and Pixtech use the switched-anode technique: dual anode [1] and triple anode [3]. In these configurations, a switched anode is flanked by non-selected and therefore non-biased, anodes. As a result, the electrons are focused onto the selected anode. The size of the beam at the anode is then less than 100 $\mu$m. However, since the distance between anodes is of the order of 30 $\mu$m, it would seem to be impossible to use a high anode voltage (greater than 1 kV). Since low-voltage phosphors have a low efficiency, the present results are not very satisfactory since the luminance of the screen obtained is low: 80 cd/m$^2$ instead of 500 cd/m$^2$ for an avionics screen.

Since the capacitance of a pixel is given by:

$$C_p = \epsilon_0 . \epsilon_r S.1/e = 0.009 \text{ p}F$$

where e is the thickness of silica between the gate and the base of the tip: 1 $\mu$m $\epsilon_r$ (silica): 4

S is the coverage area per pixel: 50 by 50 $\mu$m.

The value of P($\mu$W) obtained is $0.05 \times C_p(\text{pF}) \times V^2_{scan} = 4$ $\mu$W with $V_{scan} = 30$ V i.e. a value equivalent to that obtained for a liquid-crystal screen.

In order to obtain a high-resolution luminous screen, it is necessary to have a screen operating with an anode voltage ranging from 4 kV to 6 kV, for which the parameter X is small (≈30 $\mu$m). To do this, the beam emitted by the cathode must have a low divergence and a low energy.

Materials with a low electron affinity are known, such as carbon with a diamond structure. This is a low-field emissive material, for example for a field of between 1 and 50 V/$\mu$m, the emissivity of which is commonly ascribed to the low electron affinity of the material but which may be due to other phenomena. In the rest of the description, this material will be called "material with a low electron affinity" as is done in the art. These materials have the great advantage of emitting electrons for low extraction fields (of the order of 10 V/$\mu$m). Since it is easy to obtain such fields over a plane thin layer, it is no longer necessary to produce tips, thereby facilitating the fabrication process. For example, in a cathode with tips, it is absolutely essential to control the diameter of the holes in the extraction gate to within 0.1 $\mu$m [7].

W. Zhu et al. [8] have studied deposited films of polycrystalline diamond obtained by CVD (chemical vapour deposition) and have shown that the emission density increased strongly with the density of defects that the films contain. Certain deposition conditions make it possible to obtain layers having, for fields of the order of 30 V/$\mu$m, current densities of 10 mA/cm$^2$, i.e. a value high enough to fabricate a screen with a luminance of 300 cd/m$^2$. However, the emissive properties of the films do not seem to be very uniform since they depend greatly on the roughness (of the order of the grain size ≈5 $\mu$m) and on the defect density [9].

The invention therefore relates to a structure of a field-emission device operating at low voltage, the cathode of which has a good surface finish.

The invention therefore relates to a field-emission device comprising at least one cathode made of material with a low electron affinity, characterized in that the material with a low electron affinity is an amorphous or crystalline material.

BRIEF DESCRIPTION OF THE DRAWINGS

The various subjects and characteristics of the invention will appear more clearly in the description given by way of example and in the appended figures which show.

DESCRIPTION OF THE PREFERRED EMBODIMENTS

Figure 1A:
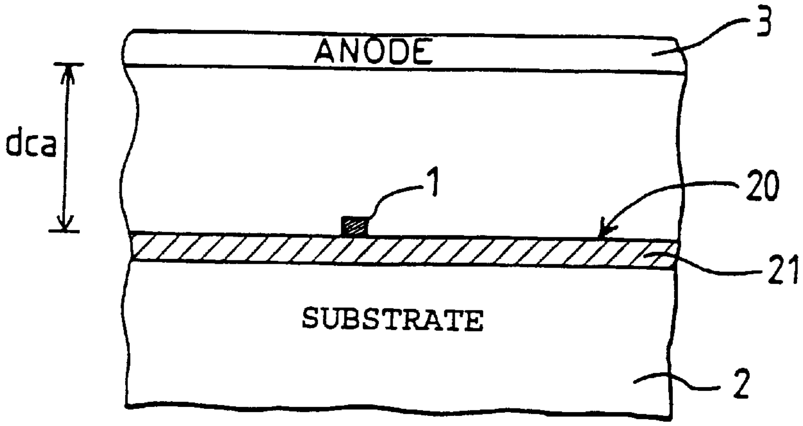
FIGS. 1*a* to 1*c*, a basic example of the field-emission device according to the invention.
Figure 1B:
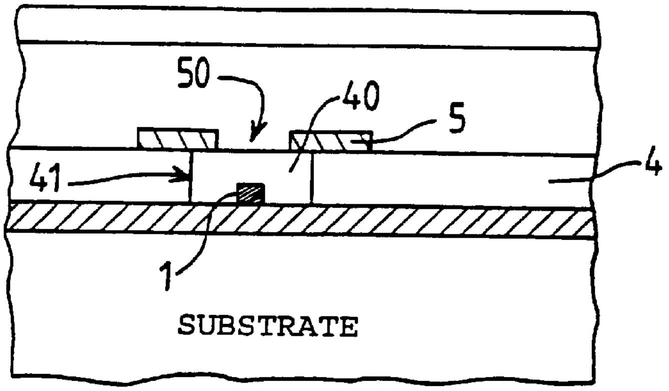
Figure 1C:
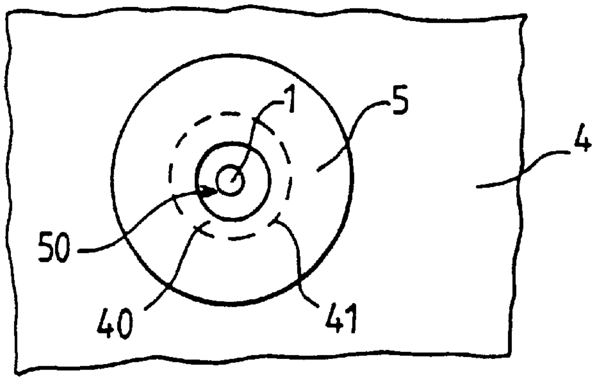

Referring to FIGS. 1*a* to 1*c*, an illustrative example of a device according to the invention will therefore be described.

FIG. 1*a* shows a base structure of the device according to the invention applied to a display device. This device comprises, on a substrate 2, a layer 21 made of material with a high electron affinity. At least one element 1 made of material with a low electron affinity, called a cathode, is located on this layer 21. The element 1 is preferably plane or almost lane. Opposite the cathode, at a distance $d_{ca}$ from the cathode, is a layer of conductive material, called the anode. The cathode is in the form of a layer.

The layer 21 is preferably conductive and allows the cathode to be electrically controlled. If the substrate has the properties of the layer 21, the latter may be omitted.

According to the invention, the cathode is made of a material deposited in amorphous form so as to have a good surface finish. Its crystalline structure could possibly be modified by a treatment after deposition (heat treatment or laser treatment). This material may be, by way of non-limiting example, made of carbon with the following structure: a—C:H; a—C:H:N.

FIGS. 1*b* and 1*c* show a more complete emission device in which a gate 5 is provided, which gate, raised to a suitable potential, makes it possible to facilitate extraction of the electrodes from the cathode and their transmission to the anode. This gate 5 is produced on an insulating layer 4 which surrounds the cathode 1. The cathode is located in a cavity 40 made in the layer 4. The dimensions of the cavity measured in a plane parallel to the plane 20 of the substrate are greater than the dimensions of the cathode. The wall 41 of the cavity is therefore at a defined distance from the cathode. In FIG. 1*c*, it may therefore be seen that the diameter of the cathode is less than the diameter of the cavity. Moreover, the gate 5 has an aperture 50 whose dimensions measured parallel to the face 20 are less than the dimensions of the cavity. In FIG. 1*c*, the diameter of the aperture 50 is less than the diameter of the cavity and greater than that of the cathode. In this way, during excitation and emission of electrons by the cathode, there will be no tendency for the electrons to be directed towards the wall 41 of the cavity 40. Thus, this wall is prevented from becoming charged and disturbing the electron emission.

Figure 2A:
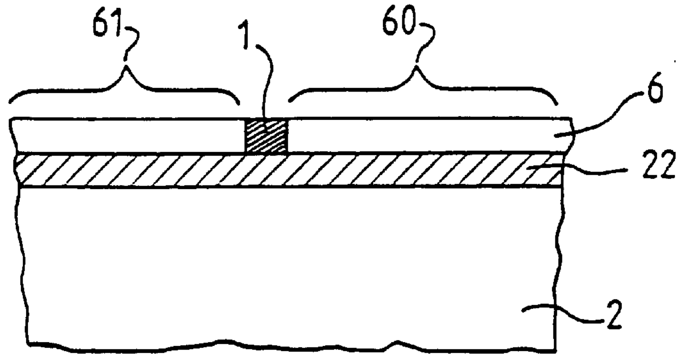
FIGS. 2*a*, 2*b*, 2*c*, alternative forms of the device in FIG. 1*b;*

FIG. 2*a* shows an alternative form of the device in FIGS. 1*a* to 1*c*, in which the cathode 1 forms part of a uniform layer 6 in which the parts 60, 61 which flank the cathode 1 are made of material with a high electron affinity. Under the application of a voltage (that applied to the cathode), there will be no tendency for these parts 60, 61 to emit electrons. The advantage of this structure is that the side flanks of the cathode do not participate in electron emission. A less divergent electron beam is therefore obtained.

Figure 2B:
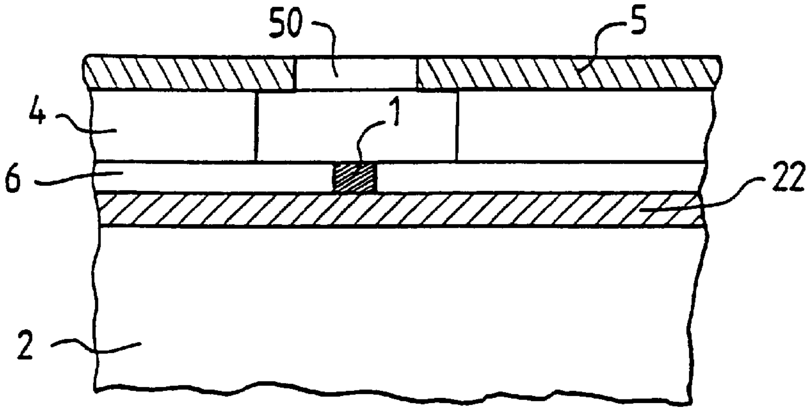

FIG. 2*b* shows the structure of FIG. 2*a* in which the layer 6 and the cathode are produced on a conducting layer 22. As in FIG. 1*b*, the layer of insulation 4 and the gate 5 are produced on this structure.

Figure 2C:
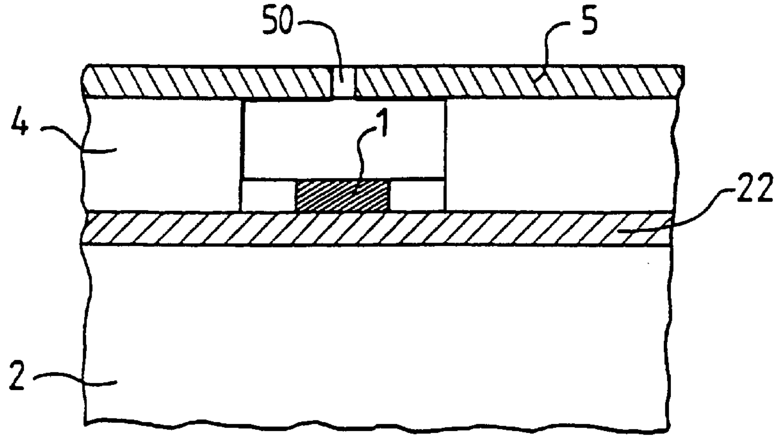

FIG. 2*c* shows an alternative form in which the layer 6 is located only in the cavity 40.

In addition, according to the alternative form in FIG. 2*c*, the cathode has dimensions (for example, a diameter) greater than those of the aperture 50 of the gate. Under these conditions, the gate acts as a diaphragm and determines the cross section of the electron beam. For example, the cathode may have a diameter of 1 μm and the aperture may have a diameter of 100 nm.

A process for producing the cathode and gate structure in FIG. 1*b* will now be described with reference to FIGS. 3*a* to 3*e*.

1$^{st}$ step (FIG. 3*a*): production, on a substrate 2, of a layer 21 of a material with a high electron affinity and then of a layer 23 of material with a low electron affinity. The material of the layer 21 may be an electrically conductive material.

2$^{nd}$ step (FIG. 3*b*): deposition of one resin stud 24 per cathode to be produced. This stud is produced by e-beam lithography. Its diameter ranges, for example, from 0.1 μm to a few μm depending on the type of cathode to be produced.

3$^{rd}$ step (FIG. 3*c*): etching of the layer 23 (for example in an oxygen plasma), thereby defining the cathode 1.

4$^{th}$ step (FIG. 3*d*): removal of the resin located above the cathode and production of a layer of insulation 4 and of a layer 51 of a conductive material.

5$^{th}$ step (FIG. 3*e*): production of an aperture 50 in the layer 51 and then production of the cavity 40 until the cathode 1 is left clear. The aperture 50 is aligned with the cathode 1. The cavity 40 may be produced by chemical etching until the walls 41 of the cavity are at a defined distance from the cathode 1.

The process in FIGS. 4*a* to 4*e* allows the structure in FIG. 2*b* to be produced.

The 1$^{st}$ and 2$^{nd}$ steps (see FIGS. 4*a* and 4*b*) are similar to the previous 1$^{st}$ and 2$^{nd}$ steps.

3$^{rd}$ step (FIG. 4*c*): in the case of the cathode of the type in FIG. 2*a*, a surface treatment makes it possible to remove the low electron affinity of the material outside the regions protected by the stud 24. Several types of treatment may be used (plasma, ion implantation, deposition of a film with a high electron affinity, etc.). Since this material is obtained under specific conditions, a surface treatment using ions obtained by a plasma or by ion implantation allows the structure or the composition of a material with a low electron affinity to be modified. For example, OH electronegative groups are known to increase the electron affinity of the diamond surface. Another possibility is to deposit a very thin film (a few nm in thickness) with a high electron affinity (for example, a metal).

4$^{th}$ step (FIG. 4*d*): deposition of the layer of insulation 4 and of the conductive layer 51.

5$^{th}$ step (FIG. 4*e*): etching of an aperture 50 in the layer 51 and of a cavity 40 in the layer 4, as in the previous 5$^{th}$ step.

Figure 5A:
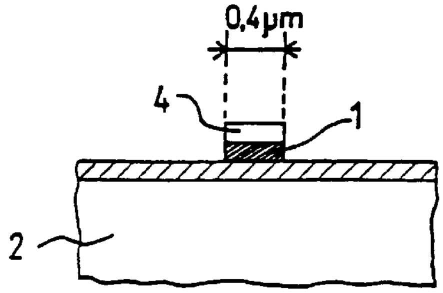
FIGS. 5*a* to 5*c*, a process for producing the device in FIG. 2*c;*
Figure 5B:
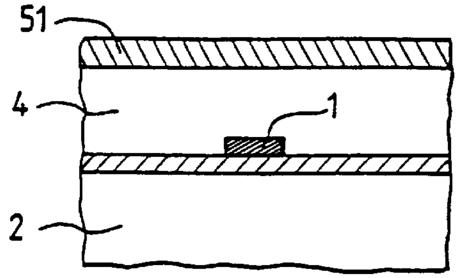
Figure 5C:
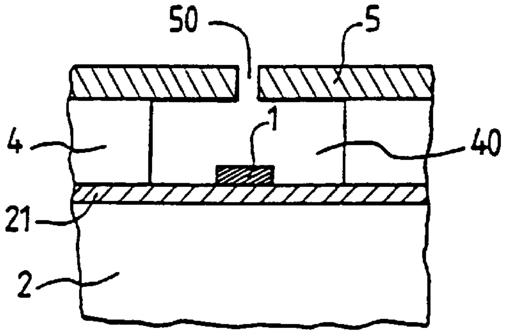

The process illustrated in FIGS. 5*a* to 5*c* allows the structure in FIG. 2*c* to be produced.

Figure 3A:
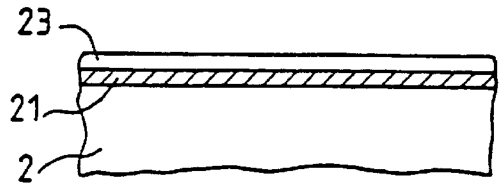
FIGS. 3*a* to 3*e*, a process for producing the device in FIG. 1*b;*
Figure 3B:
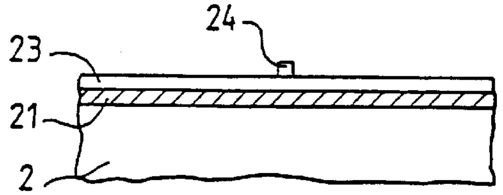
Figure 3C:
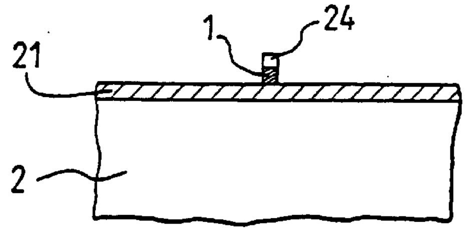
Figure 3D:
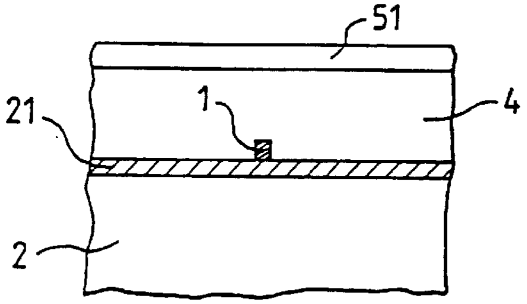
Figure 3E:
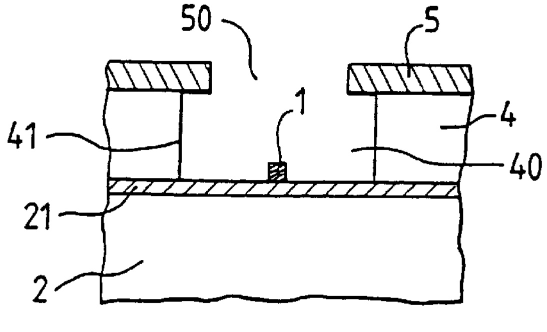
Figure 4A:
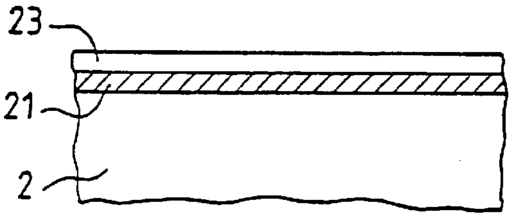
FIGS. 4*a* to 4*e*, a process for the device in FIG. 2*b;*
Figure 4B:
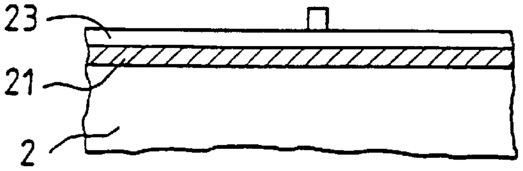
Figure 4C:
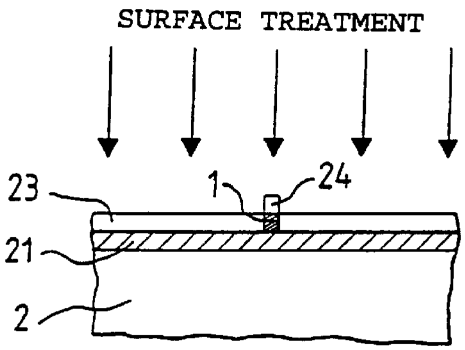

The three first steps of the process corresponding to FIGS. 3*a* to 3*c* or the three first steps of the process corresponding to FIGS. 4*a* to 4*c* are carried out. The difference lies in the fact that the resin stud 24 has a greater diameter than that in the previous embodiments; for example, it is 0.4 μm (see FIG. 5*a*).

4$^{th}$ step (FIG. 5*b*): production of the insulating layer 4 and the conducting layer 51.

5$^{th}$ step (FIG. 5*c*): production of the aperture 50 and of the cavity 40. In this process, the aperture 50 has a diameter less than that of the cathode and is, for example, 0.1 μm. It should be noted that in this case the alignment of the cathode 1 with the gate 5 is less critical.

The invention is also applicable to the production of microguns that can be used, for example, in the technique of microlithography.

Figure 4D:
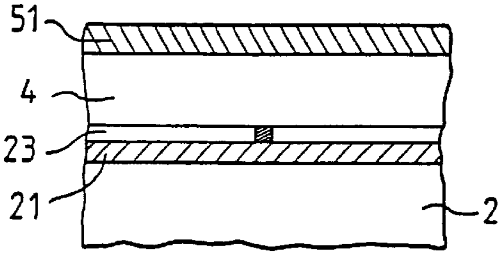
Figure 4E:
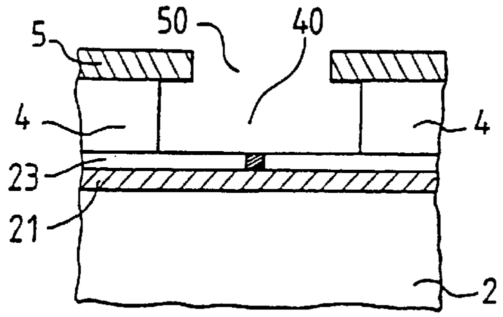

The microguns (see FIG. 6) are produced by depositing, on the structure in FIG. 4*d* for example, an insulation 4' and a conducting film 5' in both of which an aperture 50' having a diameter ≈10 μm is etched, in order to form the focusing electrode, as well as a cavity 40'. Next, in the layer 51, the aperture 50 is etched and the cavity 40 in the layer 4 is produced. The cavity 40' surrounds the aperture 50 of the gate 5 and the gate 5' surrounds the cavity 40'. This microgun therefore makes it possible to obtain a beam with a beam current ≈10 pA and a beam diameter ≈50 nm. We should point out that this diameter may be reduced by decreasing the size of the emitter.

A matrix of microguns contains of the order of 1 million microguns, making it possible to write over a field of about 5 by 5 cm. Consequently, each gun writes over an area of 50 by 50 μm. The displacement is achieved at the specimen level using piezoelectric motors, as in the case of current lithography equipment.

The cathodes thus described may be driven by switching. In a matrix arrangement of cathodes, one switching point per cathode may be provided, thereby allowing an active matrix to be produced.

Figure 12A:
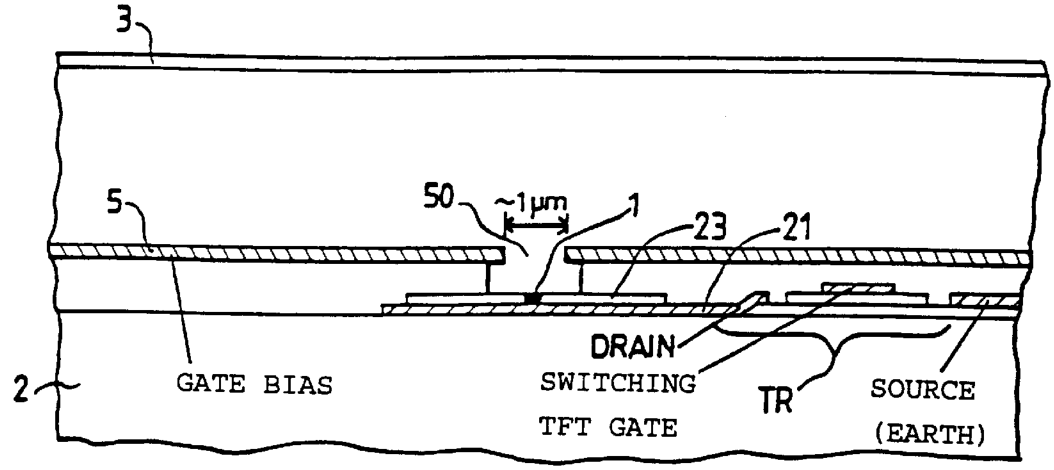
FIGS. 12*a* and 12*b*, an illustrative example of an active matrix.

FIG. 12*a* shows a field-emission display device comprising a field-effect drive transistor produced approximately in the same plane as the cathode. FIG. 12*a* again shows the anode 3, the gate 5 and the cathode 1. The layer 21 of conductive material on which the cathode is produced is connected to the drain of a transistor TR. The transistor TR is produced on the same face of the substrate 2 as the layer 21. The constitutive semiconductor layers of the field-effect transistor, together with the gate and source of the transistor, may therefore be seen.

Figure 6:
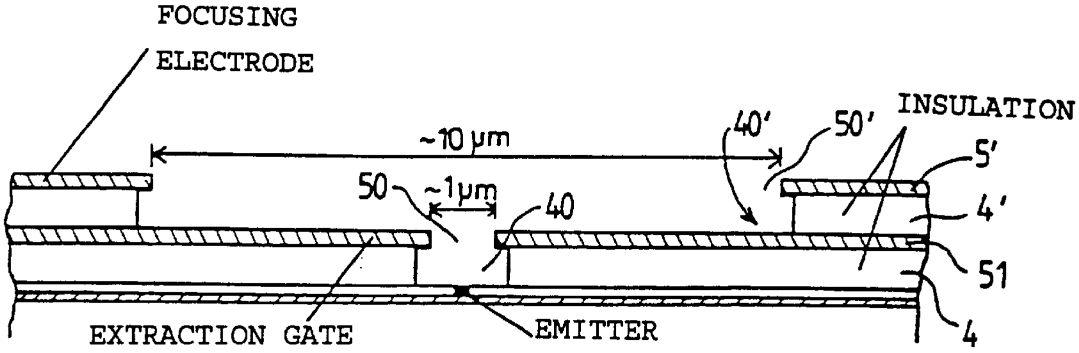
FIG. 6, the application of the invention to an electron microgun.
Figure 12B:
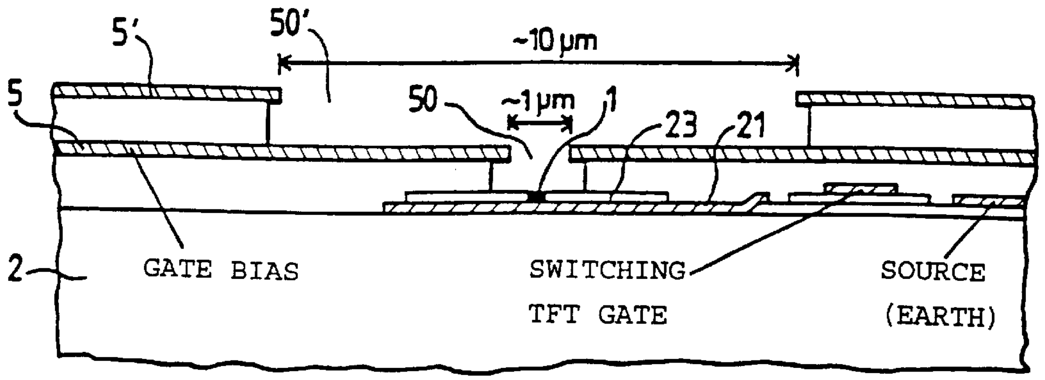

FIG. 12*b* shows an electron microgun similar to that in FIG. 6. The field-effect drive transistor has a construction similar to that in FIG. 12*a*.

An active matrix of microguns is produced by combining a circuit for addressing and controlling the various microguns. During writing at a given position of the specimen, the data required for the exposure at the next position are sampled in the capacitor Cs of each pixel. After the specimen to be treated has been displaced by a 50 nm increment, the data are simultaneously transferred to the capacitor Ct and therefore to the gate of the switching transistor until Ct is returned to earth potential by the resetting transistor. The voltage applied to the switching transistor fixes the drain current of this transistor and therefore the emission current of each microgun. Consequently, the dose received by the specimen is equal to the emission current multiplied by the inverse of the synchronization frequency.

Figure 13A:
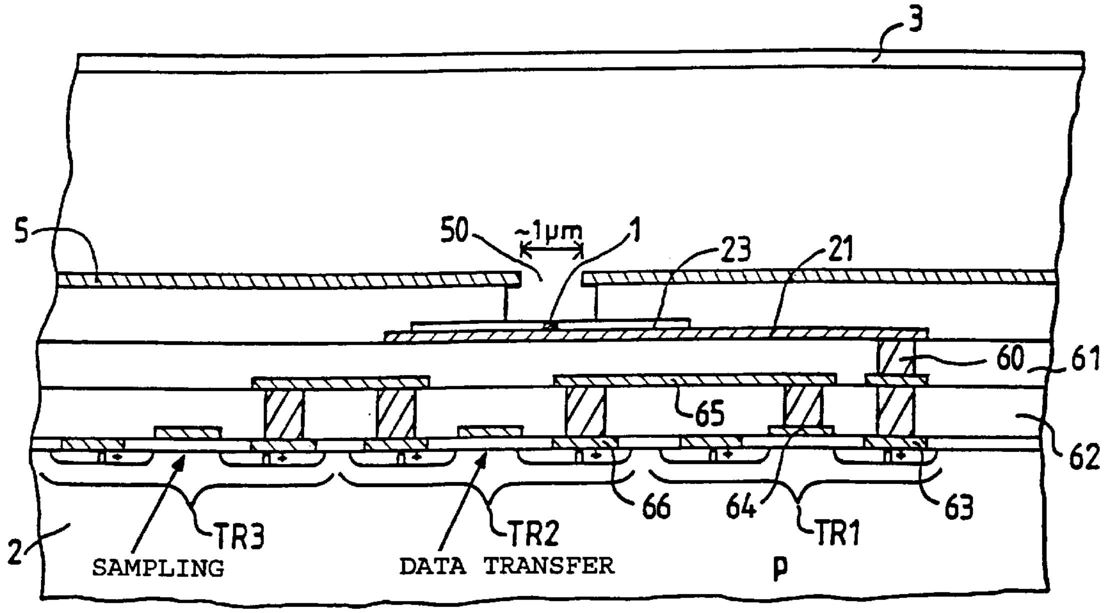
FIGS. 13*a*, 13*b* and 14, alternative embodiments of the active matrix according to the invention.

FIG. 13*a* shows how a cathode is driven, in which the drive transistor or transistors is (or are) produced in volume, that is to say in the thickness of the substrate. FIG. 13*a* shows a display device in which there is again the anode 3, the gate 5 and the cathode 1. The conducting layer 21 on which the cathode 1 is produced is connected via a conducting stud 60 through two layers of insulation 61, 62 to the drain 63 of a switching transistor.

FIG. 13*a* shows by way of example other transistors TR2 and TR3 making it possible to cause the transistor TR1 to switch in cascade. The gate 64 of the transistor TR1 is connected to the drain 66 via a connection 65 which is located between the two insulating layers 61 and 62 and which passes through the layer 62 in order to be connected to the gate 64 and to the drain 66. The transistor TR3 is connected in a similar way to the transistor TR2.

Figure 13B:
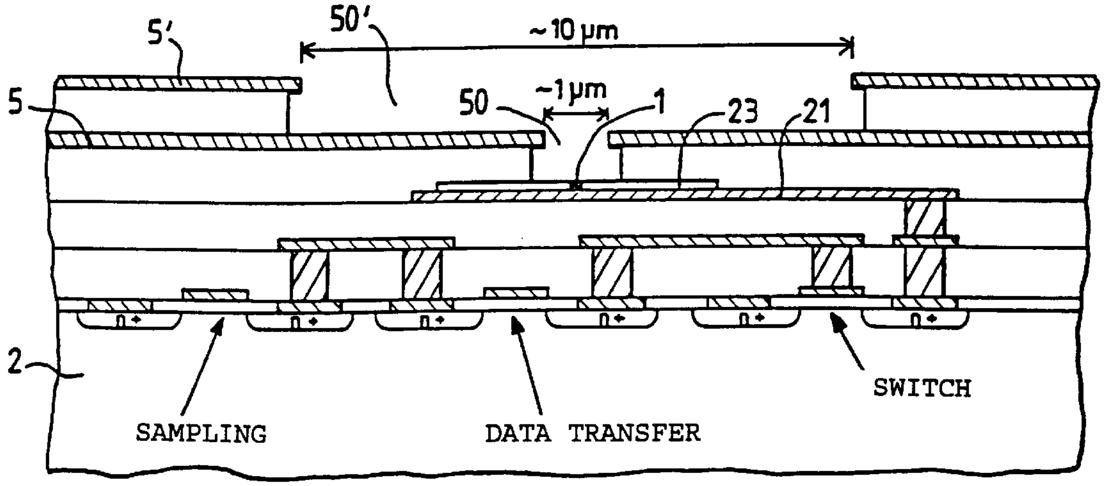

FIG. 13*b* shows the application of the drive structure in FIG. 13*a* to the microgun described in relation to FIG. 6.

Figure 14:
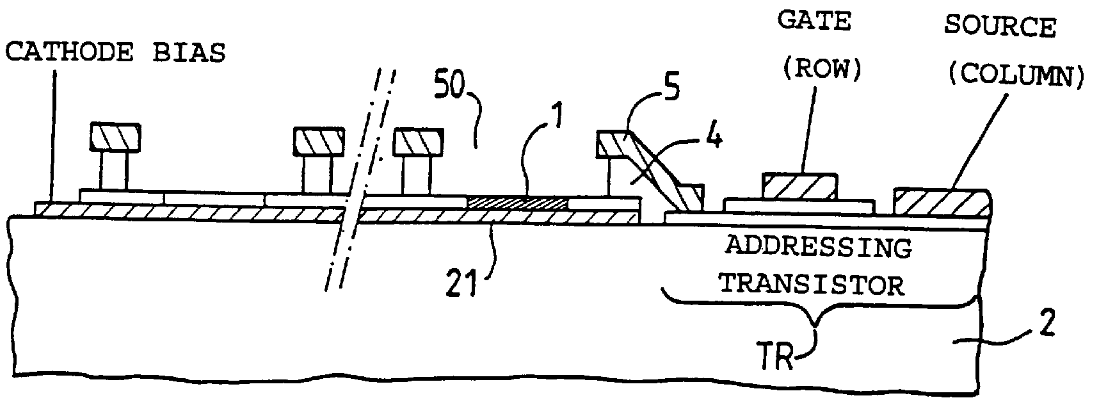

FIG. 14 shows a device in which the driving is accomplished by switching the potential applied to the gate 5 of the device. The transistor TR is thus produced in planar form on the face of the substrate and the drain of the transistor is connected to the gate 5.

An alternative form of the process for producing a field-emission device according to the invention will now be described with reference to FIGS. 7*a* to 7*d*.

Produced successively on a substrate 2 are a conducting layer 21 with a high electron affinity, a plane element 23 made of material with a low electron affinity, an insulating layer 4 and a conducting layer 51. A resin mask 6, having a central element surrounded by a peripheral element (FIG. 7*a*), is produced on this conducting layer 51. Those regions of the layers 4 and 51 which are not masked are etched (FIG. 7*b*). An additional etching operation is carried out in the element 23, thereby producing the cathode 1. Finally, the layers 4, 51 lying above the cathode 1, as well as the resin mask, are removed. During this operation, the insulation 4 is etched so as to obtain side walls 41 which are set back with respect to the edges of the gate 5 (FIG. 7*d*).

Figure 7A:
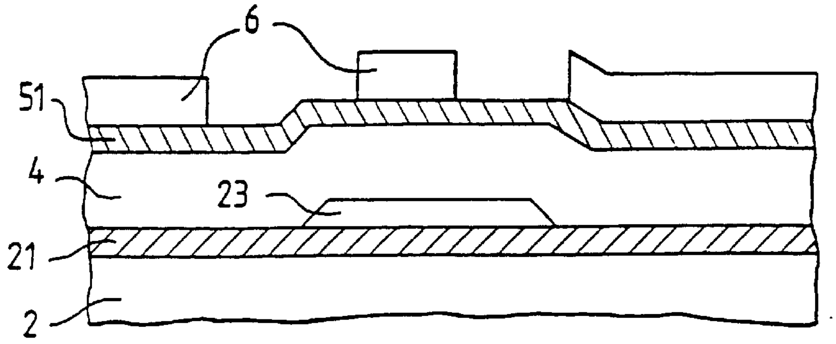
FIGS. 7*a* to 7*d*, another process for producing the device of the invention.
Figure 7B:
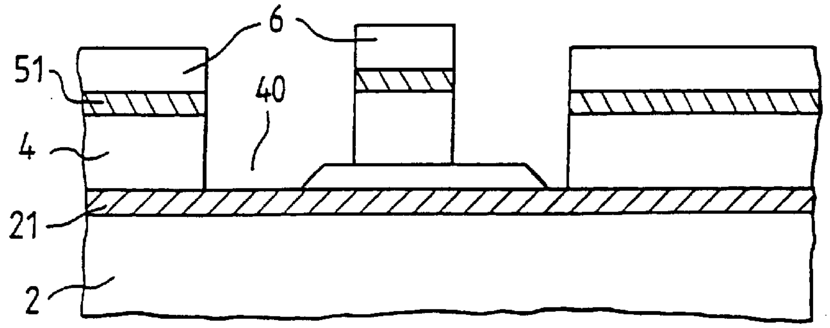
Figure 7C:
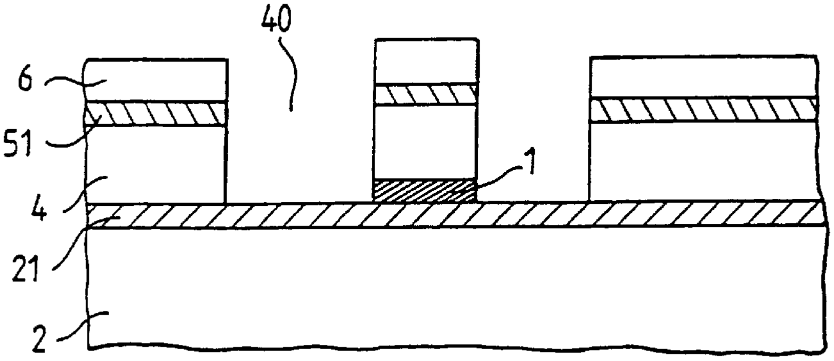
Figure 7D:
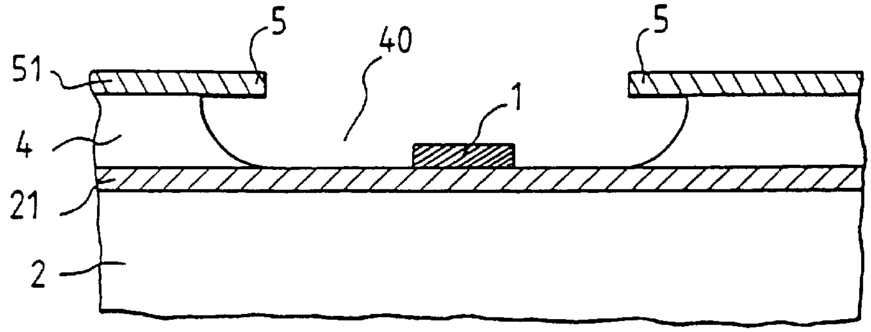

FIG. 7*a* shows that the element 23 made of material with a low electron affinity occupies a defined area. The region of the central element is above this area and the region of the peripheral element is not above this area.

Figure 8A:
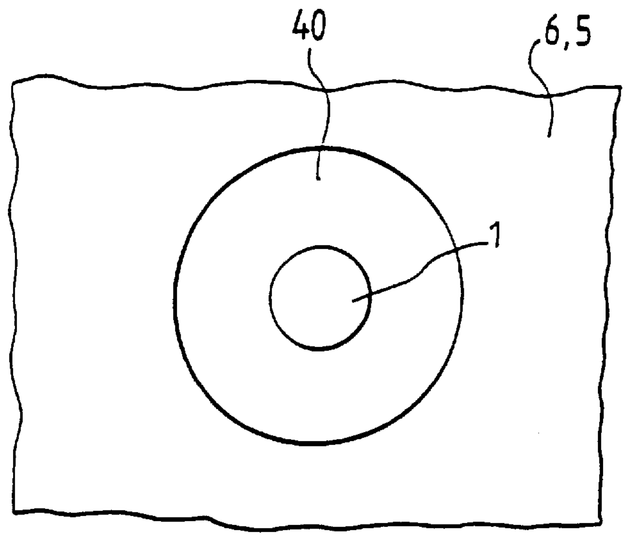
FIGS. 8*a* to 8*c*, an alternative form of the process illustrated in FIG. 7*a* to 7*d;*
Figure 8B:
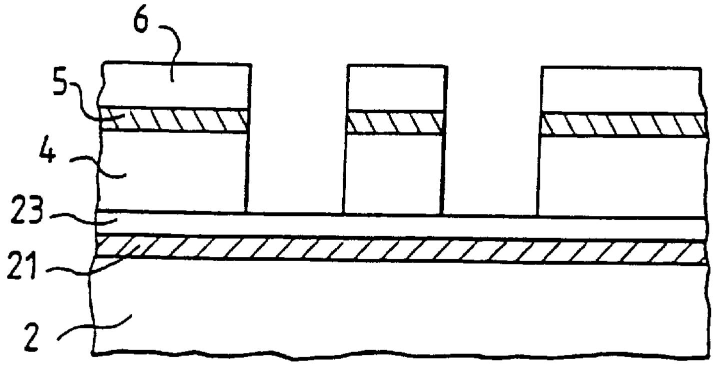
Figure 8C:
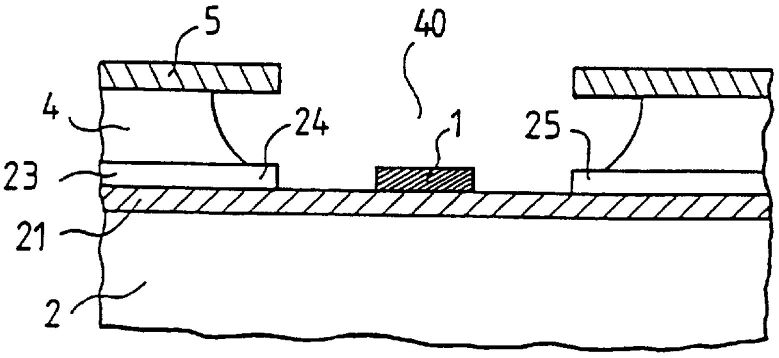

FIGS. 8*a* to 8*c* illustrate a process similar to the process illustrated in FIGS. 7*a* to 7*d*. This process differs in that the cathode 1 is produced in a layer 23 which occupies the entire area of the device. This layer 23 is then etched (FIG. 8*b*). The layers of material lying above the cathode and the resin mask are then removed. In this operation, portions 24 and 25 of the layer 23 remain in the cavity 40, which portions may, in certain cases, be the source of spurious emission.

FIG. 8*a* shows, in a top view, a circular shape in which the resin mask is made.

FIGS. 9*a* to 9*e* show another alternative form of the process for producing the device according to the invention.

Figure 9A:
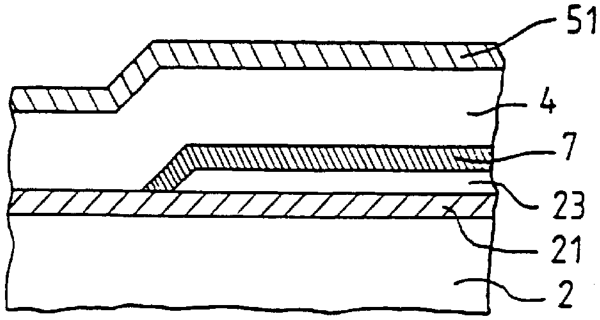
FIGS. 9*a* to 9*e* and 10*a* to 10*d*, other alternative forms of the production process according to the invention.

In this process, the element made of material with a low electron affinity is covered with a layer 7 made of material with a high electron affinity (FIG. 9*a*).

Figure 9B:
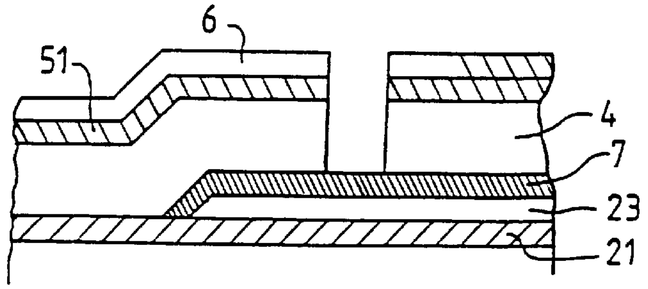
Figure 9C:
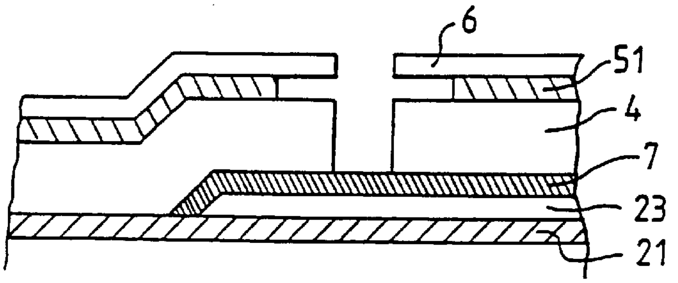
Figure 9D:
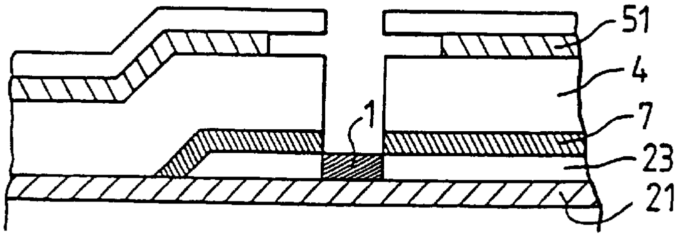

The layers 4 and 51 are etched through the resin mask 6 (FIG. 9*b*). This etching may be continued in order to etch the layer 51 more deeply (FIG. 9*c*). Next, the layer 7 with a high electron affinity is etched so as to define the cathode 1 in the layer 21 which is no longer covered by the layer 7 (FIG. 9*d*).

Figure 9E:
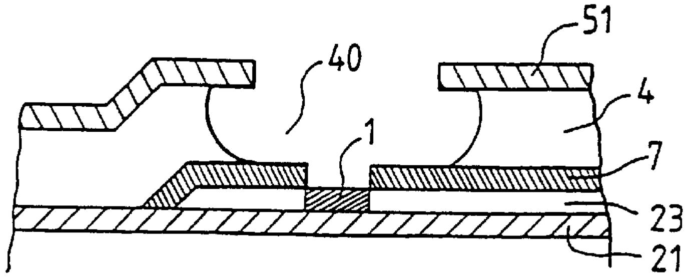

Next, the mask 6 is removed. Optionally, an additional etching step causes the layer 4 to be etched more deeply in order to enlarge the cavity 40 in the layer 4 (FIG. 9*e*).

FIGS. 10*a* to 10*d* show another alternative form of the process for producing the device according to the invention.

Figure 10A:
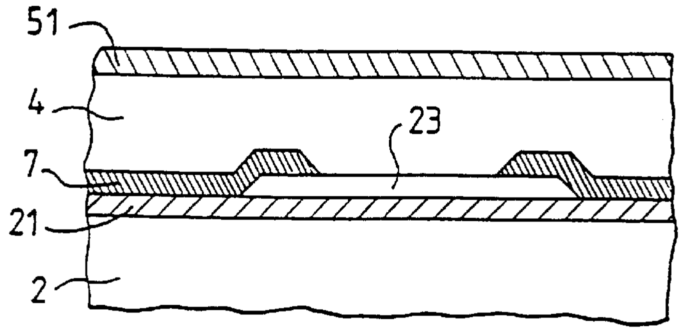

The element 23 made of material with a low electron affinity is produced on the substrate 2. This element is partially covered with a layer made of material with a high electron affinity in a region lying within the future cavity 40 to be produced, but leaving the position for the cathode 1 free (FIG. 10*a*). A layer of insulation 4 and a layer of conductive material 51 are produced on this assembly. The cavity 40 is produced in these layers (FIG. 10*b*).

Next, a layer 8 made of material with a high electron affinity (metal) is deposited on the assembly (FIG. 10*c*) so as to define the cathode 1. Finally, the layers of material lying on the cathode 1 are removed (FIG. 10*d*).

In the foregoing, provision was made to produce layers 7 and 8 made of material with a high electron affinity (see FIGS. 9 and 10). These layers may result from treatment of the layer 23 made of material with a low electron affinity, such as a chemical or ion-bombardment treatment of the surface so as to transform the treated surface so that it has a high electron affinity.

Figure 10B:
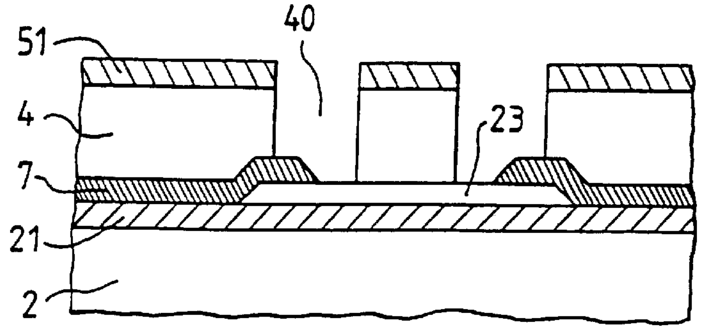
Figure 10C:
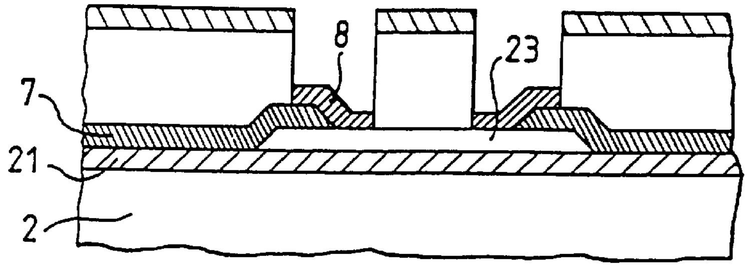
Figure 10D:
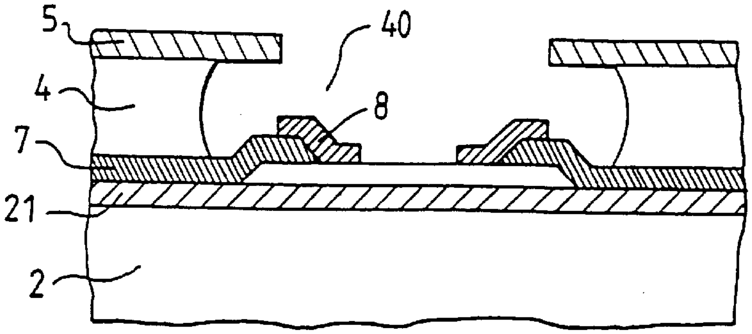

In FIG. 10*b*, the layer 7 has an aperture whose dimensions are intermediate between those of the central and peripheral regions.

Figure 11:
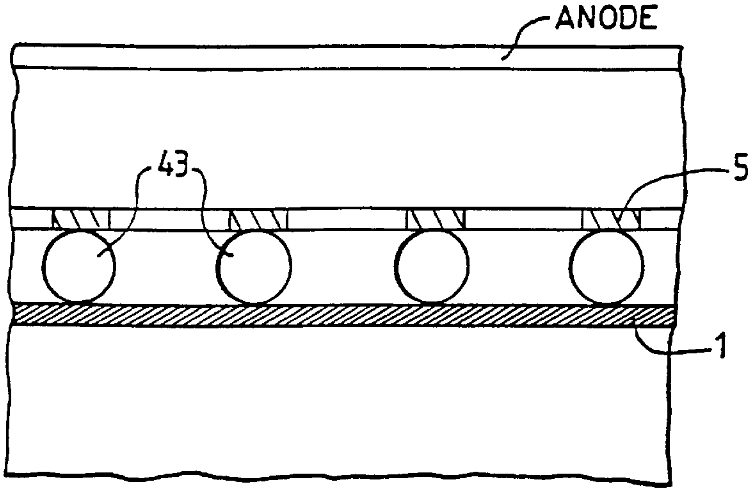
FIG. 11, a simplified lighting device according to the invention.

FIG. 11 shows a simplified alternative form of the device of the invention. This device comprises a layer 1 made of material with a low electron affinity. Elements 43 such as balls of insulating material are placed on this layer. A perforated sheet 5 (or a mesh) is placed on these balls. In order to be used, for example as a light emitter, this device is completed by an anode covered with a cathodoluminescent material (a phosphor) and placed opposite the cathode 1/gate 5 assembly. In emission mode, this device thus allows all the phosphors of the anode to be excited.

What is claimed is:

1. Field-emission device comprising:

at least one planar cathode made of a conductive material, the at least one planar cathode including, a central region having a first surface material with a low electron affinity, and a flanking region located about said central region and having a second surface material with a higher electron affinity than the first surface material, wherein the conductive material is a material deposited in an amorphous form.

2. Device according to claim 1, wherein the at least one planar cathode is located on a face of a substrate having a first layer of a dielectric material, said first layer includes:

at least o n e cavity in which the at least one planar cathode is located;

a gate of a conductive material located on said first layer, including an aperture centered in said gate with respect to the cavity.

3. Device according to claim 2, wherein the aperture has dimensions greater than the at least one planar cathode as measured in a plane parallel to the face of the substrate.

4. Device according to claim 2, wherein the cavity has dimensions measured in a plane of the face of the substrate which are greater than dimensions of the aperture measured in said plane.

5. Device according to claim 4, wherein the dimensions of the aperture are less than those of the at least one planar cathode.

6. Device according to claim 2, wherein the face of the substrate comprises a layer of material with a high electron affinity on which the at least one planar cathode is located.

7. Device according to claim 2, wherein the face of the substrate carries elements of a drive transistor including a drain connected to the at least one planar cathode, a gate, and a source.

8. Device according to claim 7, wherein the at least one planar cathode is located on a conducting layer on the substrate and connected to the drain of the transistor.

9. Device according to claim 2, wherein the at least one planar cathode is located on a conducting layer on at least one insulating layer located on said face of the substrate, and a transistor located on said face of the substrate comprises at least one electrical connection element connected to the conducting layer and passing through the insulating layer.

10. Device according to claim 1, further comprising:

an anode placed parallel to a plane of the at least one planar cathode.

11. Device according to claim 2, further comprising:

a second layer of a dielectric material located on said gate and having a cavity surrounding the aperture in said gate; and a secondary gate surrounding the cavity in said second layer of the dielectric material.

12. Process for producing a field-emission device, comprising:

producing on a planar substrate the following successive layers including, an amorphous layer made of a first surface material having a low electron affinity, a dielectric layer, and a conducting layer;

producing a mask on an assembly of the successive layers so as to mask a central region and a peripheral region of the successive layers and to leave an intermediate region of the successive layers free of the mask;

etching the successive layers in the intermediate region;

removing the mask;

forming a planar cathode from the amorphous layer by removing in the central region the conducting layer and the dielectric layer to expose said first surface material; and forming a flanking region about said central region, said flanking region formed by converting an outer part of the exposed first surface material into a second surface material having a higher electron affinity than the first surface material.

13. Process according to claim 12, wherein the step of producing successive layers comprises:

producing said amorphous layer on an area of defined dimensions of the successive layers such that the central region is entirely above said area of defined dimensions, and the peripheral region is not above said area.

14. Process according to claim 12, wherein the step of producing successive layers produces a first layer with a high electron affinity on the amorphous layer, said first layer having an aperture with dimensions intermediate between dimensions of the central and peripheral regions, wherein the step of etching is carried out only in the conducting layer and in the dielectric layer, and further comprising:

after the etching step, producing a second layer with a high electron affinity at least in the region etched in the step of etching.

15. Process for producing a field-emission device, comprising:

producing on a planar substrate the following successive layers, an amorphous layer having a first surface material with a low electron affinity, a high electron affinity layer including a second surface material having an electron affinity higher than the first surface material, a dielectric layer, and a conducting layer;

producing a mask on the successive layers so as to leave a masked region, corresponding to an area of a planar cathode to be produced, free of the mask; and forming the planar cathode from the amorphous layer by etching a part of the successive layers in the masked region, except for the amorphous layer, thereby forming on the planar cathode a flanking region including the higher electron affinity layer.

16. Process according to claim 14, wherein the first and second layers with a high electron affinity are produced by a treatment of the amorphous layer with a low electron affinity so as to transform the amorphous layer into a layer with a high electron affinity.

* * * * *